(12) United States Patent
Sato et al.

(10) Patent No.: US 10,957,490 B2
(45) Date of Patent: Mar. 23, 2021

(54) ELECTRONIC UNIT

(71) Applicant: ALPINE ELECTRONICS, INC., Tokyo (JP)

(72) Inventors: Makoto Sato, Fukushima (JP); Hiroki Haraguchi, Fukushima (JP)

(73) Assignee: ALPINE ELECTRONICS, INC., Tokyo (JP)

( * ) Notice: Subject to any disclaimer, the term of this patent is extended or adjusted under 35 U.S.C. 154(b) by 0 days.

(21) Appl. No.: 16/411,736

(22) Filed: May 14, 2019

(65) Prior Publication Data
US 2019/0392993 A1 Dec. 26, 2019

(30) Foreign Application Priority Data

Jun. 21, 2018 (JP) ................. 2018-117539

(51) Int. Cl.
*H05K 7/00* (2006.01)
*H01G 9/00* (2006.01)
*H01G 9/14* (2006.01)
*H01G 9/28* (2006.01)
*H01G 2/06* (2006.01)

(52) U.S. Cl.
CPC ............ *H01G 9/0003* (2013.01); *H01G 9/14* (2013.01); *H01G 9/28* (2013.01); *H01G 2/06* (2013.01)

(58) Field of Classification Search
USPC ......................................... 361/760
See application file for complete search history.

(56) References Cited

U.S. PATENT DOCUMENTS

2006/0050468 A1\* 3/2006 Inoue ................. H05K 3/301
361/328

FOREIGN PATENT DOCUMENTS

| JP | 2006-54106 | | 2/2006 |
| JP | 2006054106 A | \* | 2/2006 |
| JP | 2015-002258 A | | 1/2015 |
| JP | 2016-115697 A | | 6/2016 |

\* cited by examiner

*Primary Examiner* — Andargie M Aychillhum
(74) *Attorney, Agent, or Firm* — Brinks Gilson & Lione

(57) ABSTRACT

An electronic unit includes an electrolytic capacitor, a covering resin layer, and electronic components. The electrolytic capacitor is on an upper surface of an insulating substrate. The covering resin layer covers the upper surface of the insulating substrate and the electronic components. Part of the covering resin layer serves as an electrolytic capacitor covering portion. The electrolytic capacitor covering portion includes an outer peripheral covering portion that covers an outer peripheral surface of the electrolytic capacitor and a top covering portion that covers a top portion of the electrolytic capacitor. A thin wall groove is formed in the top covering portion. The outer peripheral covering portion extends upward beyond the top covering portion by a height h. The top covering portion easily breaks at the thin wall groove so that an explosion-proof valve easily operates. A region corresponding to the height h creates an operating space of the explosion-proof valve.

3 Claims, 4 Drawing Sheets

ELECTRONIC UNIT

RELATED APPLICATIONS

The present application claims priority to Japanese Patent Appln. No. 2018-117539, filed Jun. 21, 2018, the entire disclosure of which is hereby incorporated by reference.

BACKGROUND OF THE DISCLOSURE

1. Field of the Disclosure

The present disclosure relates to an electronic unit having a structure in which an electrolytic capacitor is mounted on a substrate, and the substrate and the electrolytic capacitor are continuously covered with a covering resin layer.

2. Description of the Related Art

FIG. 11 of Japanese Unexamined Patent Application Publication No. 2006-54106 describes an disclosure relating to a lighting device including an electrolytic capacitor.

In the lighting device, an electrolytic capacitor is mounted on a circuit board, and the circuit board and the electrolytic capacitor are covered with an urethane resin filling material. The electrolytic capacitor has an explosion-proof valve at the top, and the explosion-proof valve is buried in the filling material. According to Paragraph [0042] of Japanese Unexamined Patent Application Publication No. 2006-54106, when the explosion-proof valve of the electrolytic capacitor is broken down, the filling material that covers the explosion-proof valve easily deflects so as to swell and, thus, is capable of reducing and absorbing the stress caused by a breakdown of the explosion-proof valve. In addition, Japanese Unexamined Patent Application Publication No. 2006-54106 describes that at this time, a portion of the filling material that covers the explosion-proof valve is blown off.

Japanese Unexamined Patent Application Publication No. 2008-166331 describes an invention relating to an electronic equipment device. Like Japanese Unexamined Patent Application Publication No. 2006-54106, the electronic equipment device includes an electrolytic capacitor mounted on an electronic substrate, where the electrolytic capacitor has an explosion-proof valve. The electronic substrate and the electrolytic capacitor are covered with a silicone resin filling material. According to Paragraph [0030] of Japanese Unexamined Patent Application Publication No. 2008-166331, it is desirable that a thickness of the filling material be set such that when the explosion-proof valve of the electrolytic capacitor ruptures, the filling material is blown off.

SUMMARY

According to the inventions described in Japanese Unexamined Patent Application Publication Nos. 2006-54106 and 2008-166331, the explosion-proof valve of the electrolytic capacitor is covered with a synthetic resin filling material, and the surface of the filling material covering the explosion-proof valve is flat. For this reason, if part of the housing, another electronic part, or the like is placed in contact with or in close proximity to a surface of the filling material covering the explosion-proof valve, the movement of the explosion-proof valve is regulated and, thus, the explosion-proof valve does not rupture as expected. Consequently, the internal pressure of the electrolytic capacitor increases, and greater explosion may occur. According to Paragraph [0030] of Japanese Unexamined Patent Application Publication No. 2008-166331, a space is formed between the explosion-proof valve of the electrolytic capacitor and a lid when the explosion-proof valve explores. However, in an actual electronic equipment device, as described above, part of the housing, another electronic component, or the like may be placed in contact with or in close proximity to the surface of the filling material covering the explosion-proof valve. Consequently, it is difficult to reliably create the space.

In addition, according to Japanese Unexamined Patent Application Publication Nos. 2006-54106 and 2008-166331, since a portion of the filling material that covers an explosion-proof member has a uniform thickness, it is difficult to blow off the filling material without a failure by a rupture of the explosion-proof valve of the electrolytic capacitor. In particular, in Japanese Unexamined Patent Application Publication Nos. 2006-54106 and 2008-166331, an urethane resin and a silicone resin are employed as the filling materials, respectively. Since both are flexible materials, it is difficult to determine an appropriate thickness of the filling material so as to blow off the filling material without a failure by a rupture of the explosion-proof valve.

Accordingly, to solve the above-described existing problem, the present disclosure provides an electronic unit capable of ensuring a space that enables an explosion-proof valve to operate therein when an explosion-proof valve ruptures due to an increase in internal pressure of an electrolytic capacitor.

Furthermore, the present disclosure provides an electronic unit having a configuration that easily breaks down a covering resin layer that covers an explosion-proof valve when an explosion-proof valve of an electrolytic capacitor ruptures.

In one aspect of the present disclosure, an electronic unit includes a substrate, electronic components mounted on a substrate, and a covering resin layer configured to continuously cover the substrate and the electronic components. The electronic components include an electrolytic capacitor with a top portion having an explosion-proof valve mounted thereon, and part of the covering resin layer forms an outer peripheral covering portion that covers a cylindrical outer peripheral surface of the electrolytic capacitor. The outer peripheral covering portion has an upper extension portion formed thereon, and the upper extension portion extends upward beyond the top portion of the electrolytic capacitor so that an operating region in which the explosion-proof valve operates is formed above the top portion by the upper extension portion that surrounds the operating region.

In some implementations, part of the covering resin layer form a top covering portion that covers the explosion-proof valve of the electrolytic capacitor and that the top covering portion be breakable when the explosion-proof valve operates.

In some implementations, a thin wall groove is formed in the top covering portion and a thickness of the thin wall groove is set to a value such that the thin wall groove is breakable when the explosion-proof valve operates.

In another aspect of the present disclosure, an electronic unit includes a substrate, electronic components mounted on the substrate, and a covering resin layer configured to continuously cover the substrate and the electronic components. The electronic components include an electrolytic capacitor with a top portion having an explosion-proof valve mounted thereon, and part of the covering resin layer forms an outer peripheral covering portion that covers a cylindrical outer peripheral surface of the electrolytic capacitor and a top covering portion that covers the top portion. The top covering portion has a thin wall groove formed therein, and a thickness of the thin wall groove is set to a value such that the thin wall groove is breakable when the explosion-proof valve operates.

In some implementations, the outer peripheral covering portion which is part of the covering resin layer that covers the cylindrical outer peripheral surface of the electrolytic capacitor extends upward beyond the top portion of the electrolytic capacitor. As a result, even when a configuration in which the housing or another electronic component is in contact with or in close proximity to the upper end portion of the outer peripheral covering portion is employed, a space that enables the rupture of the explosion-proof valve can be ensured above the top portion of the electrolytic capacitor.

In addition, in some implementations of the electronic unit of the present disclosure, the top covering portion that covers the top portion of the electrolytic capacitor has the thin wall groove formed therein, and the thickness of the thin wall groove is set to a value such that the thin wall groove is breakable when the explosion-proof valve operates. As a result, when the explosion-proof valve ruptures, cracking of the top covering portion that covers the explosion-proof valve can be reliably produced.

DETAILED DESCRIPTION OF THE DRAWINGS

Figure 1:
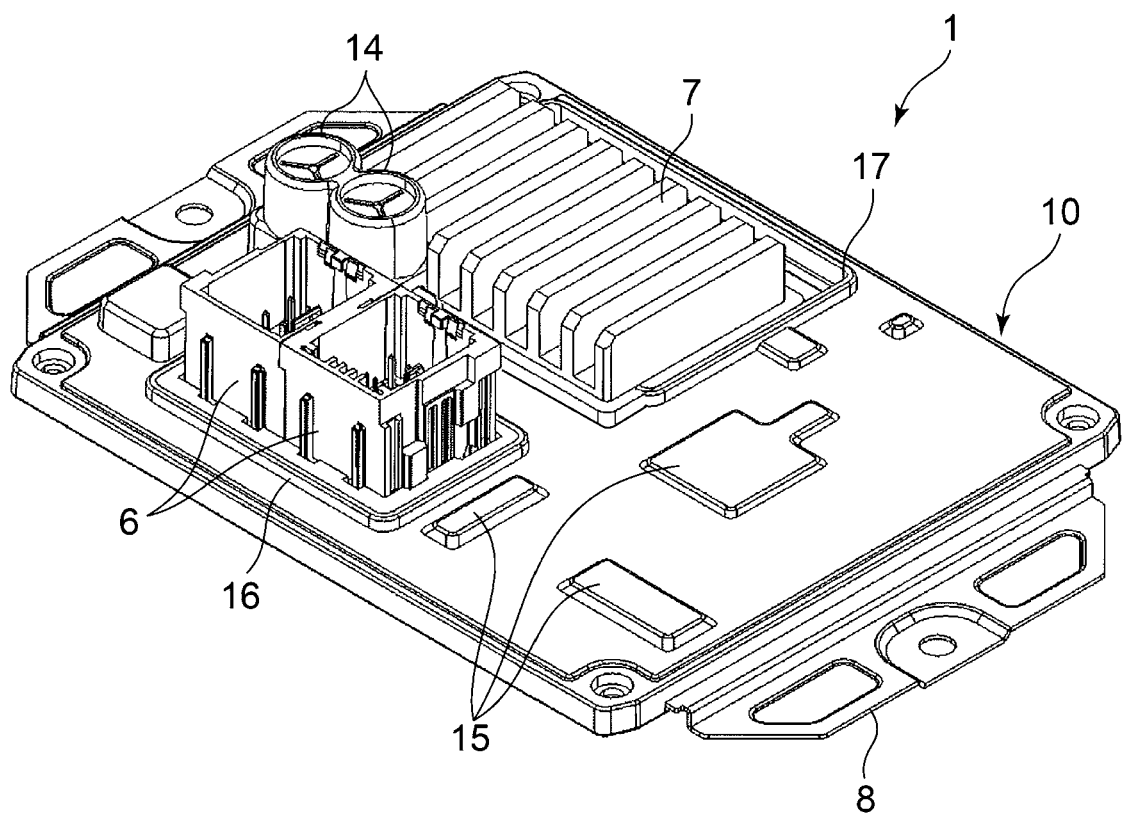
FIG. 1 is a perspective view illustrating one form of an electronic unit of the present disclosure.

FIG. 1 illustrates one form of an electronic unit 1 according to the present disclosure. The electronic unit 1 is an in-vehicle audio amplifier and is a digital amplifier.

Figure 2:
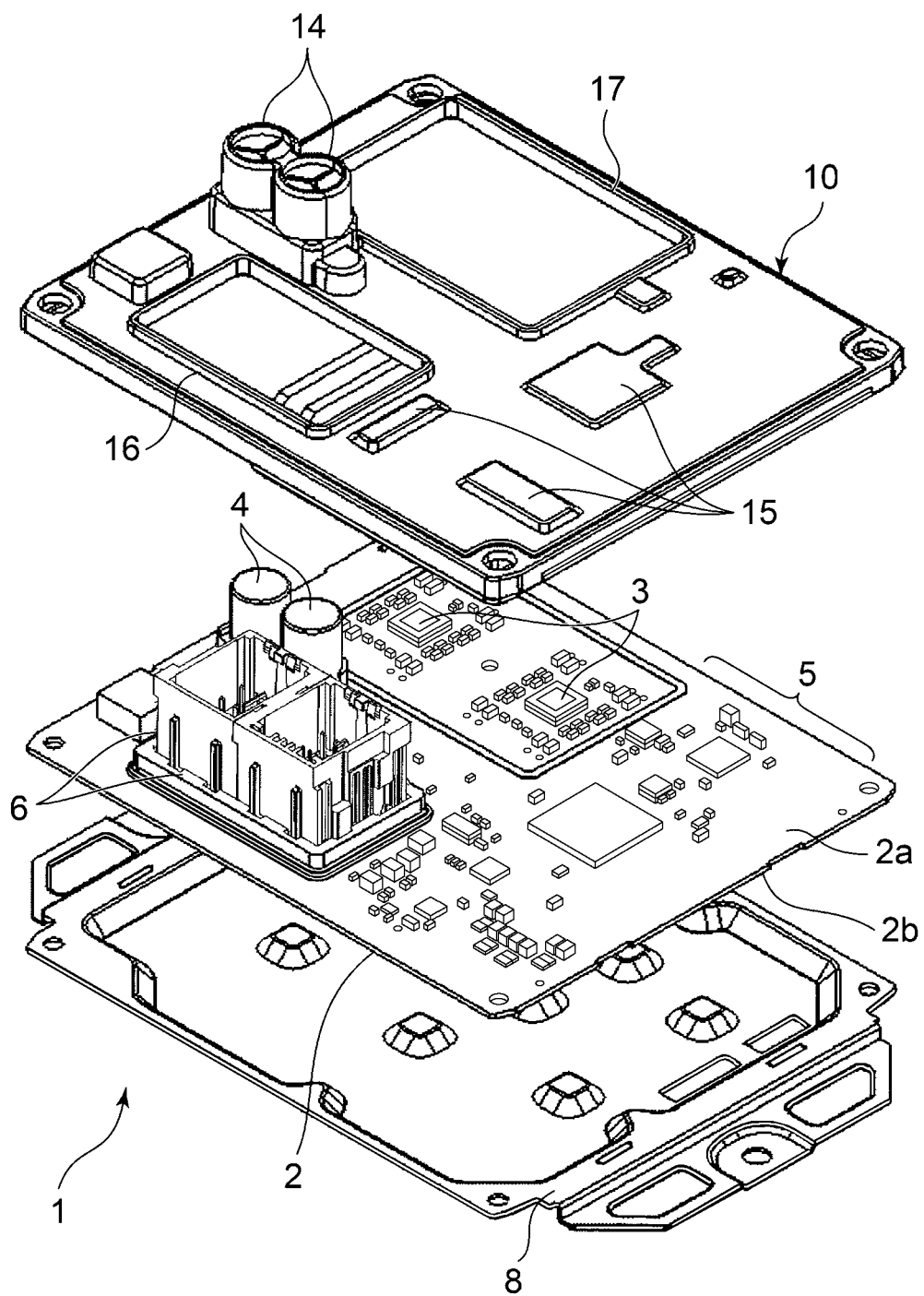
FIG. 2 is an exploded perspective view of a substrate and a reinforcing metal plate separated from each other in the electronic unit illustrated in FIG. 1.

As illustrated in the exploded perspective view of FIG. 2, the electronic unit 1 includes an insulating substrate 2. As illustrated in FIG. 2, the insulating substrate 2 has an upper surface 2a facing upward and a lower surface 2b facing downward. The term "up-down direction" as used here is the up-down direction of the electronic unit 1. As illustrated in FIG. 2, the lower surface 2b of the insulating substrate 2 is placed on top of a reinforcing metal plate 8, and the insulating substrate 2 and the reinforcing metal plate 8 are fixed to each other by using, for example, screws.

A variety of electronic components are mounted on the upper surface 2a of the insulating substrate 2. The electronic components include two digital amplifier integrated circuits (ICs) 3, two electrolytic capacitors 4, and an electronic component group 5 of the other electronic components. The electronic component group 5 includes an IC and a variety of chip components. The upper surface 2a of the insulating substrate 2 has two connectors 6 mounted thereon. Furthermore, as illustrated in FIG. 1, the upper surface 2a of the insulating substrate 2 has a heat sink 7 mounted thereon. The heat sink 7 covers the two digital amplifier ICs. The heat sink 7 is made of a metal material having an excellent thermal conductivity, such as aluminum. The outer peripheral portion of the heat sink 7 is adhered to the upper surface 2a of the insulating substrate 2 by a double-sided adhesive tape.

The insulating substrate 2 and the electronic components mounted on the insulating substrate 2 are covered with a covering resin layer 10. The covering resin layer 10 is made of an adhesive thermoplastic resin, which is a polyester based hot melt resin. The covering resin layer 10 is formed by hot-melt molding. In the hot-melt molding, the digital amplifier IC 3, the two electrolytic capacitors 4, the two connectors 6, and the electronic component group 5 of the other electronic components are soldered on the insulating substrate 2. In addition, the heat sink 7 is placed on the digital amplifier IC 3, and the insulating substrate 2 and the electronic components mounted on the insulating substrate 2 are placed in a mold. Thereafter, heated and melted hot melt resin is injected into the mold at a low pressure.

As illustrated in FIG. 1 and FIG. 2, the covering resin layer 10 is formed so as to continuously cover the upper surface 2a of the insulating substrate 2, the electrolytic capacitors 4, the lower peripheral portion of the heat sink 7, the electronic component group 5, and the lower peripheral portion of the connectors 6. As a result, covering resin layer 10 has, formed therein, an electrolytic capacitor covering portion 14 that covers the two electrolytic capacitors 4, a heat sink covering portion 17 that covers the lower peripheral portion of the heat sink 7, an electronic component covering portion 15 that covers the electronic component group 5, and a connector covering portion 16 that covers the lower peripheral portion of the two connectors 6.

Figure 3:
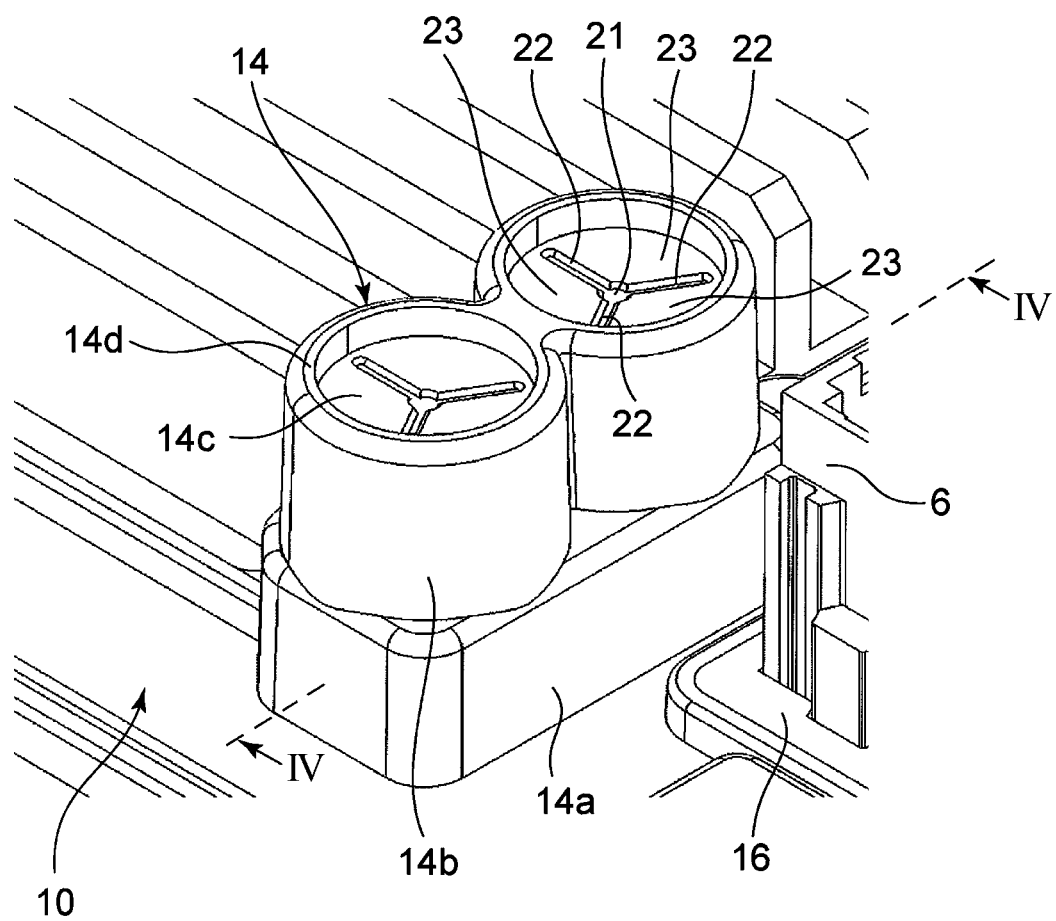
FIG. 3 is a partially enlarged perspective view illustrating an area in which electrolytic capacitors of the electronic unit illustrated in FIG. 1 are mounted, viewed in a direction opposite to that of FIG. 1.
Figure 4:
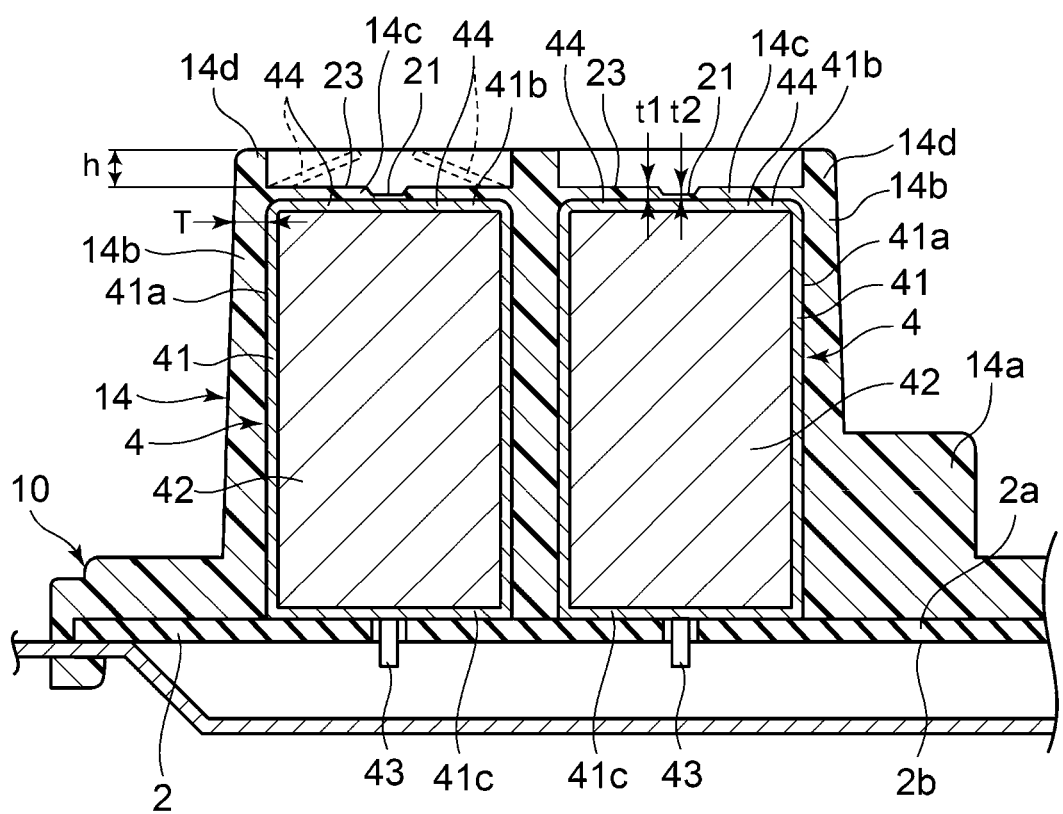
FIG. 4 is a partial cross-sectional view of the area in which the electrolytic capacitors are mounted, taken along the line IV-IV of FIG. 3.

The electrolytic capacitor covering portion 14 is illustrated in FIG. 3 and FIG. 4. As illustrated in the sectional view of FIG. 4, each of the electrolytic capacitors 4 is configured by setting a capacitor element 42 inside a cylindrical metal case 41. The capacitor element 42 is composed of an electrode, an electrolytic solution, and the like. A terminal 43 electrically connected to the electrode extends downward from a bottom portion 41c of the metal case 41. The bottom portion 41c of the metal case 41 is mounted on the upper surface 2a of the insulating substrate 2, and the terminal 43 extends to the lower surface 2b via a through-hole of the insulating substrate 2. The terminal 43 is soldered to a conductive layer formed on the lower surface 2b.

The metal case 41 of the electrolytic capacitor 4 has the bottom portion 41c, a cylindrical outer peripheral surface 41a, and a top portion 41b directed upward of the insulating substrate 2. When the ambient temperature rises and, thus, the internal pressure of the electrolytic capacitor 4 rises beyond a prescribed value, the explosion-proof valve 44, which is part of the top portion 41b of the metal case 41, starts operating. Accordingly, the top portion 41b bursts so that the internal pressure of the electrolytic capacitor 4 escapes to the outside of the metal case 41. In this manner, the explosion phenomenon of the electrolytic capacitor 4 can be prevented by the operation of the explosion-proof valve 44.

As illustrated in FIG. 3 and FIG. 4, the electrolytic capacitor covering portion 14, which is part of the covering resin layer 10, includes a base portion covering portion 14a that covers the upper surface 2a of the insulating substrate 2 and the lower peripheral portion of the metal case 41, an outer peripheral covering portion 14b that covers the cylindrical outer peripheral surface 41a of the metal case 41, and a top covering portion 14c that covers the top portion 41b of the metal case 41.

As illustrated in FIG. 3, the top covering portion 14c is circular in shape. The portion 14c has, formed therein, a center thin wall portion 21 located in a small circular area located at the center of the circular shape and a plurality of thin wall grooves 22 each extending from the center thin wall portion 21 in a radial direction of the circular shape. In addition, part of the top covering portion 14c where the center thin wall portion 21 and the thin wall grooves 22 are not formed function as separating portions 23. As illustrated in FIG. 4, a thickness t1 of the separating portion 23 is smaller than a thickness T of the outer peripheral covering portion 14b. In addition, a thickness t2 of the center thin wall portion 21 is smaller than the thickness t1 of the separating portion 23. Furthermore, the thickness of the thin wall groove 22 is the same as the thickness t2 of the center thin wall portion 21.

As illustrated in FIG. 3 and FIG. 4, an upper extension portion 14d is formed on the upper part of the outer peripheral covering portion 14b of the electrolytic capacitor covering portion 14. The upper extension portion 14d has a thick cylindrical shape. The upper extension portion 14d extends upward beyond the top portion 41b of the metal case 41 and further extends beyond the top covering portion 14c of the electrolytic capacitor covering portion 14. The height h of the upper extended portion 14d of the outer peripheral covering portion 14b that extends upward from the surface of the top covering portion 14c is set to a value such that when the internal pressure of the electrolytic capacitor 4 rises and, thus, the explosion-proof valve 44 breaks and deforms upward, the deformation can be allowed. That is, the electrolytic capacitor covering portion 14 has an operating region of the explosion-proof valve 44 formed therein above the top portion 41b and the top portion covering portion 14c. The operating region is surrounded by the upper extension portion 14d of the outer peripheral covering portion 14b. The protrusion height h needs to be set to a height having a margin in consideration of the variation in the size of each of the portions so that a space required for the opening operation performed by the explosion-proof valve 44 of the electrolytic capacitors 4 is ensured. If a widely used electrolytic capacitor 4 is used, it is desirable that the protrusion height h be greater than or equal to 5 mm.

The electronic unit 1 illustrated in FIG. 1 is used as an in-vehicle audio amplifier. In the electronic unit 1, the upper surface 2a of the insulating substrate 2 and the electronic components are covered with the covering resin layer 10 formed through hot melt molding. Thus, waterproofness can be ensured, and the electronic unit 1 need not be stored in the housing. As a result, the electronic unit 1 can be installed in, for example, the trunk room of an automobile in a manner as illustrated in FIG. 1 without any change.

If the ambient temperature where the electronic unit 1 is used becomes abnormally high and, thus, the internal pressure of the metal case 41 of the electrolytic capacitor 4 exceeds the prescribed value, which represents an abnormal value, the explosion-proof valve 44 provided in the top portion 41b of the metal case 41 breaks out and attempts to release the internal pressure of the metal case 41. At this time, when the internal pressure of the metal case 41 acts on the top covering portion 14c of the electrolytic capacitor covering portion 14 through the explosion-proof valve 44, the center thin wall portion 21 and the thin wall grooves 22 each having a small thickness break in the portion 14c. Accordingly, the separating portions 23 separates from one another due to the breakage. In this manner, the internal pressure of the electrolytic capacitor 4 can be released to the outside of the covering resin layer 10.

As illustrated in FIG. 4, the upper extension portion 14d of the outer peripheral covering portion 14b of the electrolytic capacitor covering portion 14 protrudes upward beyond the explosion-proof valve 44 and the top portion covering portion 14c. In addition, a space surrounded by the upper extension portion 14d serves as an operating space in which the explosion-proof valve 44 can operate and open upward, as illustrated by a broken line in FIG. 4. As a result, even when the upper extension portion 14d of the electrolytic capacitor covering portion 14 is in close proximity to or in contact with the inner surface of the housing or even when another electronic component is in close proximity to or in contact with the upper extension portion 14d, a space in which the explosion-proof valve 44 and the separating portion 23 of the covering portion 14c operates upward can be ensured. Consequently, design and assembling of the electronic unit 1 can be made without considering whether the housing or another part is in close proximity to or in contact with the top covering portion 14c, which increases the flexibility of design and facilitates the assembling work.

Since, in the electrolytic capacitor covering portion 14, the electrolytic capacitors 4 are completely covered with the covering resin layer 10, excellent waterproofness can be provided. In addition, when the internal pressure of the electrolytic capacitor 4 rises, the explosion-proof valve 44 becomes easy to operate. Furthermore, a working space of the explosion-proof valve 44 can be ensured.

The present disclosure is characterized in that the outer peripheral covering portion 14b of the covering resin layer 10 extends to a position higher than the top portion 41b of the electrolytic capacitor 4. In terms of the characteristic, the top portion 41b of the electrolytic capacitor 4 does not have to be covered with the top covering portion 14c of the covering resin layer 10. That is, the top portion 41b of the electrolytic capacitor 4 may be exposed to the outside.

In addition, the upper extension portion 14d of the outer peripheral covering portion 14b may have a square tubular shape or the like. Alternatively, the upper extension portion 14d may be formed by a plurality of protrusions extending upward at intervals in the circumferential direction so as to surround the explosion-proof valve 44, rather than being cylindrical.

What is claimed is:

1. An electronic unit comprising:
    a substrate;
    electronic components mounted on the substrate; and
    a covering resin layer configured to continuously cover the substrate and the electronic components,
    wherein the electronic components include an electrolytic capacitor with a top portion having an explosion-proof valve mounted thereon, and part of the covering resin layer forms an outer peripheral covering portion that covers a cylindrical outer peripheral surface of the electrolytic capacitor;
    wherein the outer peripheral covering portion has an upper extension portion formed thereon, and the upper extension portion extends upward beyond the top portion of the electrolytic capacitor so that an operating region in which the explosion-proof valve operates is formed above the top portion by the upper extension portion that surrounds the operating region;
    wherein part of the covering resin layer forms a top covering portion that covers the explosion-proof valve of the electrolytic capacitor, and
    wherein when the explosion-proof valve operates, the top covering portion is breakable.

2. The electronic unit according to claim 1, wherein a thin wall groove is formed in the top covering portion, and wherein a thickness of the thin wall groove is set to a value such that the thin wall groove is breakable when the explosion-proof valve operates.

3. An electronic unit comprising:
a substrate;
electronic components mounted on the substrate; and
a covering resin layer configured to continuously cover the substrate and the electronic components,
wherein the electronic components include an electrolytic capacitor with a top portion having an explosion-proof valve mounted thereon, and part of the covering resin layer forms an outer peripheral covering portion that covers a cylindrical outer peripheral surface of the electrolytic capacitor and a top covering portion that covers the top portion, and
wherein the top covering portion has a thin wall groove formed therein, and a thickness of the thin wall groove is set to a value such that the thin wall groove is breakable when the explosion-proof valve operates.

* * * * *